US009774811B1

(12) United States Patent
Ebihara et al.

(10) Patent No.: US 9,774,811 B1
(45) Date of Patent: Sep. 26, 2017

(54) RAMP SIGNAL GENERATOR FOR DOUBLE RAMP ANALOG TO DIGITAL CONVERTER

(71) Applicant: OmniVision Technologies, Inc., Santa Clara, CA (US)

(72) Inventors: Hiroaki Ebihara, Santa Clara, CA (US); Zheng Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/277,642

(22) Filed: Sep. 27, 2016

(51) Int. Cl.
*H03M 1/56* (2006.01)
*H04N 5/378* (2011.01)
*H03K 5/24* (2006.01)
*H03K 4/502* (2006.01)
*H03M 1/66* (2006.01)

(52) U.S. Cl.
CPC ............. *H04N 5/378* (2013.01); *H03K 4/502* (2013.01); *H03K 5/249* (2013.01); *H03M 1/66* (2013.01)

(58) Field of Classification Search
CPC .......... H03M 1/66; H03K 5/129; H04N 5/378
USPC ........................ 341/122, 155, 144, 169, 172
See application file for complete search history.

(56) References Cited

U.S. PATENT DOCUMENTS

| 9,055,250 B2 | 6/2015 | Park et al. |
| 2014/0266309 A1* | 9/2014 | Jakobson ............... H04N 5/378 327/63 |
| 2015/0237274 A1* | 8/2015 | Yang ...................... H04N 5/378 348/308 |

OTHER PUBLICATIONS

Figueiredo et al., "Kickback Noise Reduction Techniques for CMOS Latched Comparators," IEEE Express Briefs, vol. 53, No. 7, pp. 541-545, Jul. 2006.

* cited by examiner

*Primary Examiner* — Peguy Jean Pierre
(74) *Attorney, Agent, or Firm* — Christensen O'Connor Johnson Kindness PLLC

(57) ABSTRACT

Apparatuses and methods for image sensors with increased analog to digital conversion range are described herein. An example method may include disabling a first auto-zero switch of a comparator, the first auto-zero switch coupled to a ramp voltage input of the comparator, increasing, by a ramp generator, an auto-zero voltage level of a ramp voltage provided to the ramp voltage input of the comparator, and disabling a second auto-zero switch of the comparator, the second auto-zero switch coupled to a bitline input of the comparator.

21 Claims, 10 Drawing Sheets

RAMP SIGNAL GENERATOR FOR DOUBLE RAMP ANALOG TO DIGITAL CONVERTER

TECHNICAL FIELD

This disclosure relates generally to image sensors, and in particular but not exclusively, relates to increased analog to digital conversion range of an image sensor.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The intensity of the light may influence the amount of charge generated in each pixel, with higher intensity generating higher amounts of charge. The charge may be converted into a digital representation of the charge by analog-to-digital converter (ADC) circuits in the image sensor based on a comparison to a reference voltage signal. However, if the amount of generated charge is more than the voltage range of the ADC circuits, the digital representation of the charge may not be correct.

Many techniques have been employed to increase the voltage range of the ADC circuits. However, some of these techniques may not provide the desired range.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
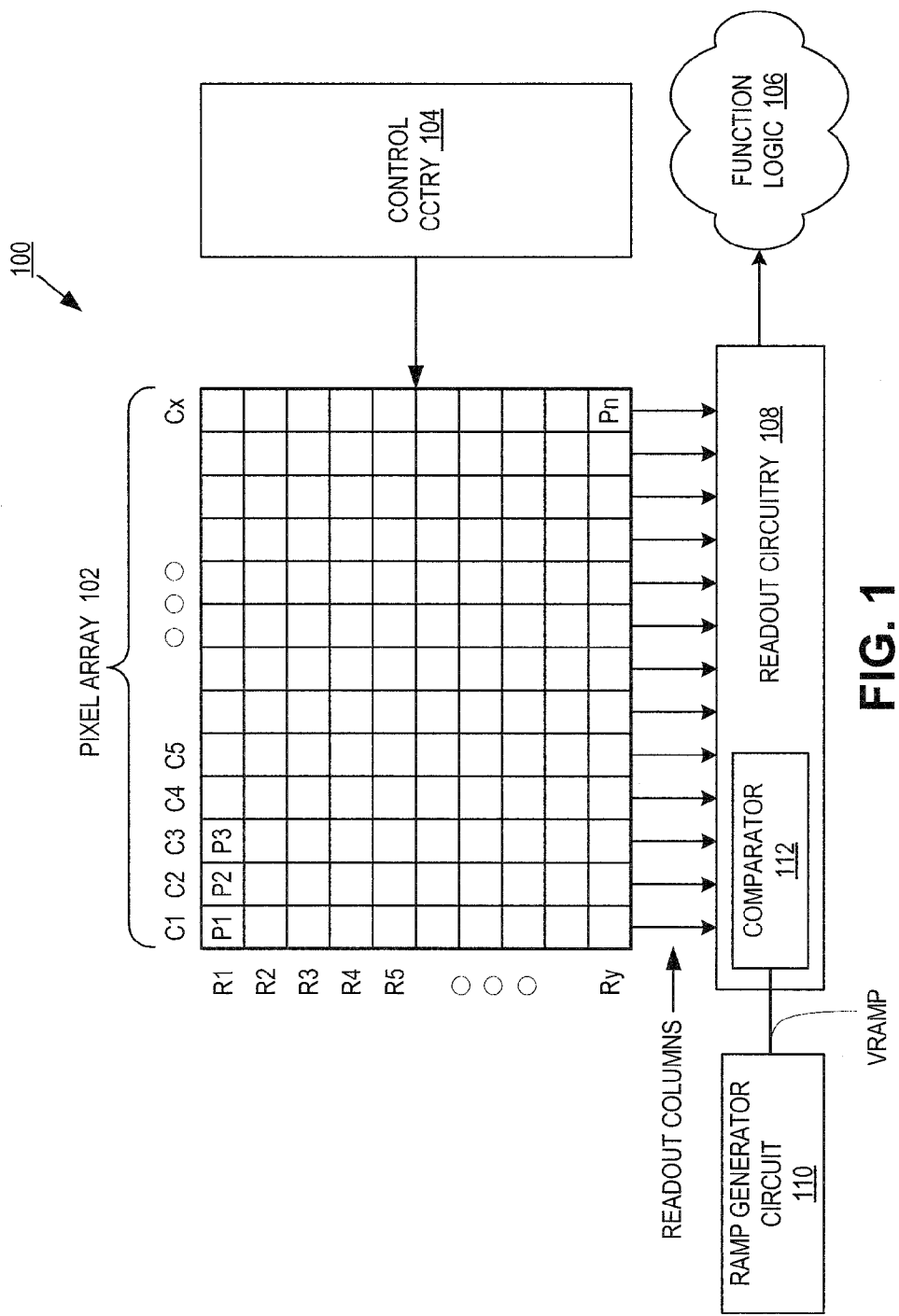
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with increased analog to digital conversion range are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 108 and then transferred to function logic 106. Readout circuitry 108 may be coupled to readout image data from the plurality of photodiodes in pixel array 102. In various examples, readout circuitry 108 may include amplification circuitry, analog-to-digital (ADC) conversion circuitry, or otherwise.

In some embodiments, one or more comparators 112 may be included for each of the readout columns. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

To perform ADC, for example, the readout circuitry 108 may receive a reference voltage VRAMP from a ramp generator circuit 110. VRAMP may be received by the comparator 112, which may also receive image charge from a pixel of the pixel array 102. The comparator 112 may determine a digital representation of the image charge based on a comparison of VRAMP to the image charge voltage level. The signal VRAMP may be at various voltage levels depending on the timing of the ADC operation, and may be used to auto-zero the inputs of the comparator 112 before image charge is received, e.g., read, by the readout circuitry 108. In some embodiments, VRAMP may be increased when the inputs are auto-zeroed, which may provide an increase to the voltage range used during signal comparison, for example. Although ramp generator 110 is shown as a separate block of the imaging system 100, ramp generator 110 may be included in other blocks, such as the column readout circuit 108, or a voltage generator block (not shown).

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 2:
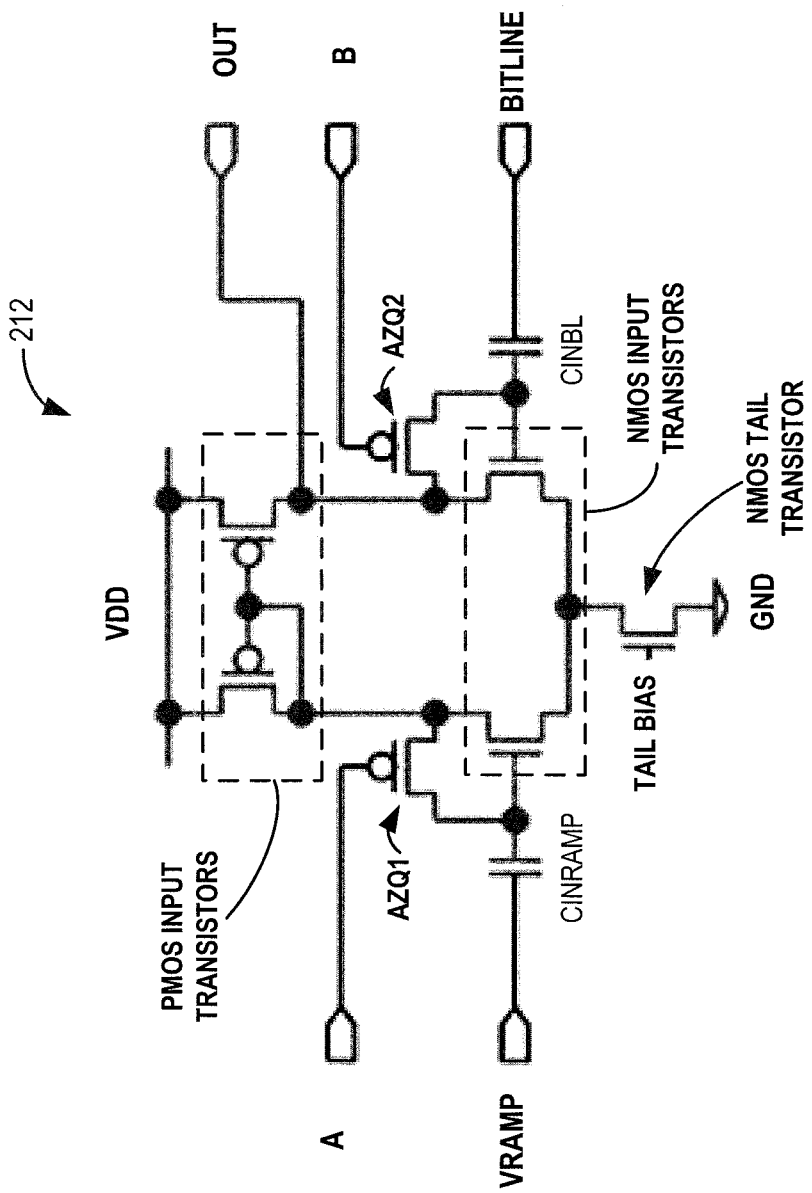
FIG. 2 is a comparator in accordance with an embodiment of the present disclosure.

FIG. 2 is a comparator 212 in accordance with an embodiment of the present disclosure. The comparator 212 may be an example of the comparator 112. The comparator 212 may provide an output signal in response to a comparison of an image charge signal received on the bitline input to a reference voltage signal VRAMP received on the VRAMP input. The output signal may provide a digital representation of the received image charge signal, for example.

The illustrated embodiment of the comparator 212 includes an NMOS trail transistor coupled between a reference voltage, ground in some examples, and two NMOS input transistors. The two NMOS input transistors may be coupled in parallel between the NMOS tail transistor and two respective PMOS transistors. The two PMOS transistors may be coupled in parallel between the two NMOS input transistors and a reference voltage, VDD for examples. The two PMOS transistors may further be coupled together by their gates. Additionally, the comparator 212 may include two auto-zero switches, AZQ1 and AZQ2, coupled between gates of respective ones of the two NMOS input transistors and the drain sides of the same NMOS input transistors. In some embodiments, two noise filtering capacitors, CINREF and CINBL, may be included to capacitvely couple their respective inputs to the gates of the two NMOS input transistors.

The comparator 212 may be described as having a reference voltage input side and a bitline, e.g., image charge, input side. The reference voltage input side may receive a reference voltage VRAMP, and the bitline input side may receive an image charge voltage signal. The reference voltage input side may include one of the NMOS input transistors, auto-zero switch AZQ1, and one of the PMOS transistors. The gate of the PMOS transistor of the reference voltage input side may be coupled to a drain of the same transistor, which may result in the gate both PMOS transistors coupled to the drain. The image charge input side may include one of the NMOS transistors, auto-zero switch AZQ2, and one of the PMOS transistors.

The NMOS tail transistor may be coupled to receive a TAIL BIAS signal at a gate, which may enable/disable the NMOS tail transistor, and in turn the comparator 212.

In operation, the comparator 212 may compare a voltage level of an image charge signal on the bitline input to a voltage level of the VRAMP reference signal during an ADC operation. FIG. 3B provides an example of VRAMP reference signal. The voltage range of the VRAMP signal during ADC, e.g., between t6 and t7 of FIG. 3B, may be used to determine the image charge level, for example. However, prior to ADC, the inputs to the comparator, e.g., VRAMP and bitline, may be normalized, e.g., auto-zeroed, to a base voltage level of VDD−Vds of the PMOS transistors, which may be referred to herein as the auto-zero voltage level. Control signals A and B provided to the gates of AZQ1 and AZQ2, respectively, may couple/decouple the gates of the NMOS input transistors from their respective sources before an ADC operation is performed. Normalizing the voltages on the gates of the NMOS input transistors may force the inputs to the same voltage level so to remove any error or noise from the ADC operation.

In some embodiments, increasing the auto-zero voltage level may allow the comparator 212 to determine larger image charge values. One technique to increase the auto-zero voltage level may be to increase the voltage of VRAMP during an auto-zero operation of the comparator 212. For example, a voltage level of VRAMP may be increased while the comparator 212 is normalized, such as after AZQ1 is disabled but before AZQ2 is disabled, an example of which is provided in FIG. 3B. Increasing the auto-zero voltage may result in an increase in the voltage range of the comparator 212 because the voltage difference between the auto-zero voltage level and a minimum input voltage level may be increased, which may result in the increase in the voltage range of the comparator 212.

Figure 3A:
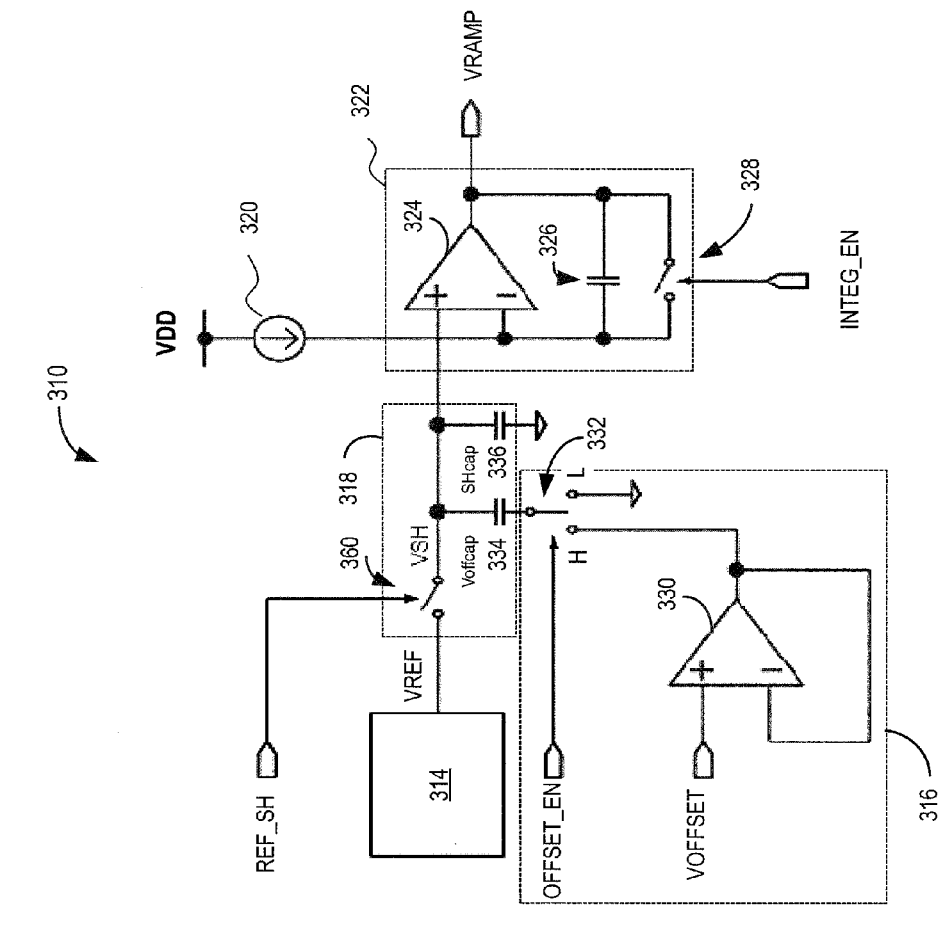
FIG. 3A is an illustrative block diagram of a ramp generator in accordance with an embodiment of the present disclosure.
Figure 3B:
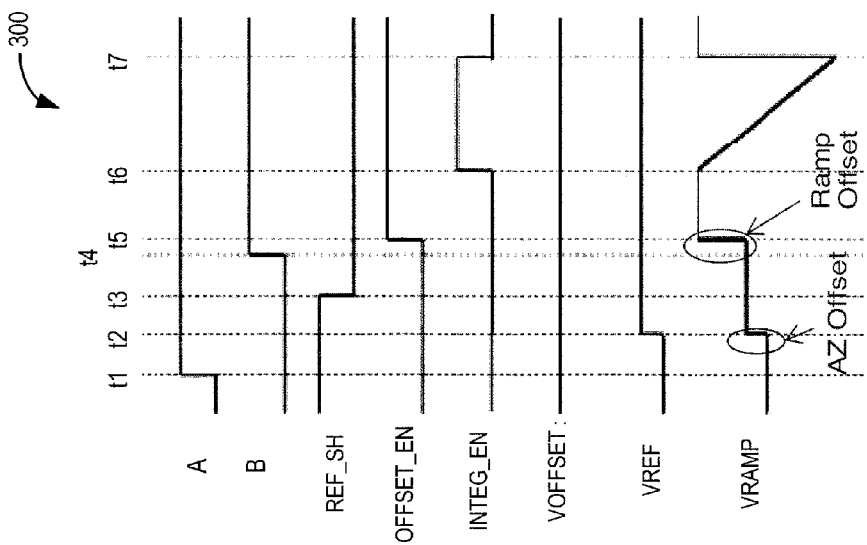
FIG. 3B is an example timing diagram in accordance with an embodiment of the present disclosure.

FIG. 3A is an illustrative block diagram of a ramp generator 310 in accordance with an embodiment of the present disclosure. The ramp generator 310 may be an example of the ramp generator circuit 110. The ramp generator 310 may generate the reference voltage signal VRAMP, which may be provided to imaging system readout circuitry, such as readout circuitry 108. Comparators, such as the comparator 112 and/or 212, one of which may be associated with each readout column, e.g., bitline, of an imaging system, may receive the reference voltage signal VRAMP. The comparators may compare image charge signals on the readout columns to the VRAMP signal and output digital signals accordingly.

The illustrated embodiment of the ramp generator 310 includes reference voltage generator 314, ramp offset generator 316, voltage sample and hold (VSH) circuit 318, current source 320, and integrator 322. The reference voltage generator 314 provides reference voltage VREF to an input of the VSH circuit 318. Ramp offset generator 316 generates an offset voltage Ramp Offset, and provides the same to the VSH circuit 318 via capacitor Voffcap 334. VSH circuit 318 provides VREF and various offset voltages to the integrator 322, which provides voltage signal VRAMP. VRAMP may be based on VREF and current provided by the current source 320, for example, depending on an operation of the ramp generator 310. As will be discussed in more detail below, VRAMP varies over time in response to the various circuits of ramp generator 310 operating in response to one or more control signals. The control signals may be provided by an imaging system control circuit, such as the control circuit 104 for example.

The illustrated embodiment of the ramp offset generator 316 includes an amplifier 330 and a switch 332. Ramp offset generator 316 may provide offset voltage Ramp Offset to the VSH circuit 318 in response to a control signal. The amplifier 330 may receive a voltage signal VOFFSET at a non-inverting input and may receive an output of the amplifier 330 at an inverting input. The output of the amplifier 330 may further be coupled to one terminal of the switch 332. The switch 332 may be a three-terminal switch with a second terminal coupled to ground, and a third terminal coupled to one side of the VSH circuit 318 capacitor Voffcap 334. The switch 332 may be controlled by a control signal OFFSET_EN, which may cause the switch to couple the output of the amplifier 330 to Voffcap 334 in response to OFFSET_EN transitioning to or being at a high logic level, e.g., at a high. When OFFSET_EN transitions to or is at a low logic level, e.g., at a low, switch 332 may couple ground to Voffcap 334 in response. The voltage of VOFFSET may be a voltage level proportional to the voltage level of Ramp Offset.

The illustrated embodiment of the VSH circuit 318 includes a switch 360, the voltage offset capacitor Voffcap 334, and a sample and hold capacitor SHcap 336. VSH circuit 318 may sample and hold voltages provided by reference voltage generator 314 and ramp offset generator 316 and provide the same to the integrator 322. The VSH circuit 318 may provide the reference voltages, which may be a combination of voltages as will be discussed in more detail below, while isolated from the various reference generators so as to prevent noise generated in either reference voltage generator 314 and ramp offset generator 316 from being provided to integrator 322 and onto the comparator 212, for example. VSH circuit 318 may sample VREF when switch 360 is closed in response control signal REF_SH being high. Upon REF_SH transitioning to a low logic level, switch 360 opens, resulting in isolating VSH circuit 318 from reference voltage generator 314. Ramp Offset voltage may be added to VREF based on the control of switch 332, as discussed above. Capacitor SHcap 336 may hold VREF, which may include the Ramp Offset voltage, and provide the same to the integrator 322.

The illustrated embodiment of the integrator 322 includes an amplifier 324, a feedback capacitor 326 and a switch 328. Integrator 322 may generate VRAMP based on VREF, ramp offset, and a current provided by current source 320. Amplifier 324 may have a non-inverting input coupled to receive VREF from VSH circuit 318, and an inverting input coupled to receive current from current source 320 and/or a feedback signal from an output of the amplifier 322. The feedback signal may change depending on a state of a control signal INTEG_EN. For example, when switch 328 is open due to INTEG_EN being low, the output of amplifier 322, which may also be VRAMP, may decreases from VSH to a low voltage based on a level of current provided by current source 320 due to feedback capacitor 326 providing feedback to the inverting input of the amplifier 322. Conversely, when switch 328 is closed, feedback capacitor 326 may be bypassed by the output of the amplifier 322 and VRAMP may be equal to VSH.

FIG. 3B is an example timing diagram 300 in accordance with an embodiment of the present disclosure. Timing diagram 300 will be used to illustrate the operation of the ramp generator 310. Additionally, timing diagram 300 illustrates the relative timing of the ramp generator 310 and the operation of an ADC comparator receiving VRAMP, such as the comparator 212. As such, control signals shown in FIG. 2 are included in the timing diagram 300. In general, the ramp generator 310 may increase an auto-zero voltage of an ADC comparator, such as the comparator 212. Reference to comparator 212 may be made throughout the present disclosure, but should not be considered limiting.

Prior to time t1, control signals A and B, which control auto-zero switches AZQ1 and AZQ2, for example, may be at a low level thereby enabling AZQ1 and AZQ2. As a result, gates of the NMOS input transistors may be coupled to an auto-zero voltage, which may be VDD−Vds (as discussed above). Additionally, and also prior to time t1, ramp generator 310 may be providing VREF to VSH circuit 318 due to switch 360 being closed, which may be closed in response to REF_SH being at the high level.

At time t1, control signal A transitions to the high logic level, which disables AZQ1. As a result, the gate of the NMOS input transistor of the comparator 212 coupled to receive VRAMP is disconnected from its drain.

At time t2, the voltage level of VREF may be increased by an amount proportional to the threshold voltage (Vth) of the NMOS input transistors of the comparator 212. The amount of the increase to VREF may be referred to herein as AZ Offset. By adding AZ Offset to VREF, VRAMP is increased proportionally.

At time t3, control signal REF_SH may transition low, which may result in switch 360 opening so to isolate reference voltage generator 314 from VSH circuit 318 and in turn integrator 322. After time t3, VREF including the auto-zero increase AZ Offset is held by VSH circuit 318.

A time t4, control signal B may transition to high disabling AZQ2. As a result, the bitline input of comparator 212 may now be ready to receive image charge signal.

Prior to time t5, control signal OFFSET_EN may be low, which may cause switch 332 to couple ground to the capacitor Voffcap 334. At time t5, however, OFFSET_EN may transition high, which may cause switch 332 to be coupled to the output of the amplifier 330 of ramp offset generator 316 instead of ground. As a result, Voffcap 334 may be charged to a voltage proportional to Ramp Offset based on VOFFSET, which may cause VREF, and ultimately VRAMP, to increase by an amount of voltage equal to the Ramp Offset voltage.

Prior to time t6, switch 328 may be closed, which may cause the output of the amplifier 324 to charge capacitor 326 to a level commensurate with VSH. AS such, VRAMP may be the same voltage as VSH. At time t6, however, control signal INTEG_EN may transition high, which may open switch 328. As a result, the output of the amplifier 324 may be coupled to the inverting input of the amplifier 324 via the feedback capacitor 326 and most of the current from the current source 320 charges the feedback capacitance. Because of the feedback from the output of the amplifier to the negative input, the voltage of the negative input may be kept at almost same voltage as VSH and so the voltage of the output of the amplifier 324 may begin to drop. Accordingly at time t6, VRAMP may begin to decrease commensurate with the current flow from the current source 320. VRAMP may decrease in a negative ramp, for example, until time t7. At time t7, INTEG_EN transitions low resulting in opening switch 328 and bringing VRAMP back to VSH=VREF+AZ Offset+Ramp Offset. After t7, a subsequent integration may occur.

The addition of AZ Offset to VREF may occur when the analog gain of the ADC, for example, is low. The gain of the ADC can be changed by changing the slope of the ramp signal. The slope of the ramp signal can be changed by changing the size of the feedback capacitance 326 or the current from the current source 320. Or the comparator may have an attenuator, e.g. capacitance divider, to reduce the amplitude of the ramp signal and changing the gain of the attenuator, the gain of the ADC can be changed. However, if the analog gain of an ADC receiving VRAMP is high, 2 times the analog gain for example, the addition of AZ Offset may be omitted.

Figure 4A:
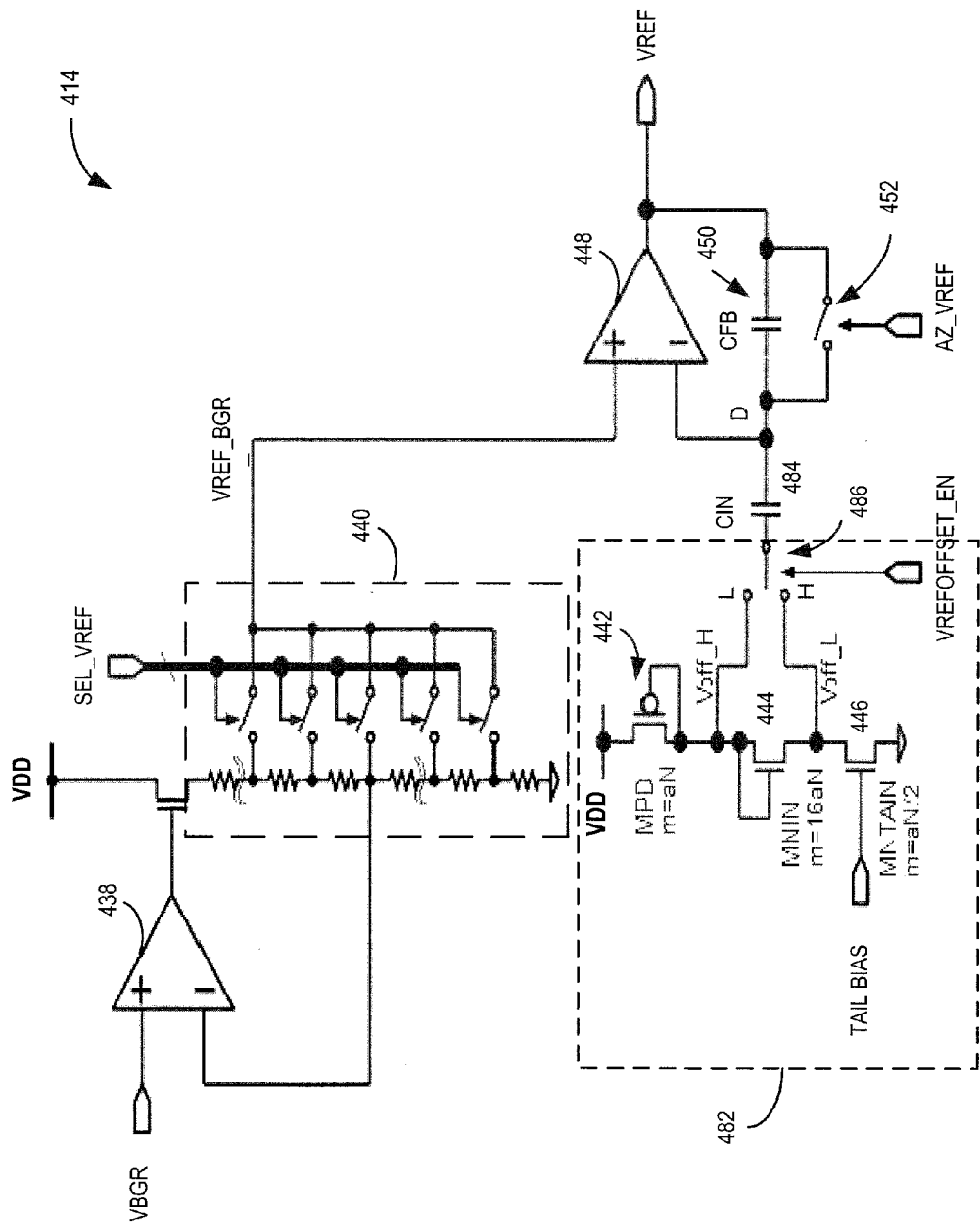
FIG. 4A is an example schematic of a reference voltage generator in accordance with an embodiment of the present disclosure.

FIG. 4A is an example schematic of a reference voltage generator 414 in accordance with an embodiment of the present disclosure. Reference voltage generator 414 may be an example of the reference voltage generator 314. The reference voltage source 414 may generate VREF and AZ Offset and provide the same to a voltage sample and hold circuit, such as VSH circuit 318 for example. Additionally, the reference voltage generator 414 may adjust for process variation to ensure the AZ Offset is proportional Vth of the NMOS input transistors of comparator 212, for example.

The illustrated embodiment of the reference voltage generator 414 includes an amplifier 438, a voltage divider 440, an auto-zero offset voltage generator 482, an amplifier 448, a feedback capacitor CFB 450, a switch 452, and an input capacitor CIN 484. The amplifier 438 may be coupled to receive a reference voltage VBGR at a non-inverting input and coupled to receive feedback through a voltage divider 440 at an inverting input. An output of the amplifier 438 is coupled to a gate of a transistor, which may be coupled between VDD and the voltage divider 440. The voltage divider 440 includes a plurality of resistors coupled in series between a source of the transistor and ground. A node may be formed between each of the resistors, and each node may be coupled to an output node of the voltage divider 440 through a respective switch. A control signal SEL_VREF that determines the state, e.g., open or closed, of each of the switches may be received by the voltage divider 440. As a result, an output voltage VREF_BGR may be determined in response to the control signal SEL_VREF and a value of VBGR.

The amplifier 448 may receive the reference voltage VREF_BGR at a non-inverting input and may receive a voltage on node D at an inverting input. The voltage level of VREF, as will be discussed below, may depend on a state of the switch 452 and the state of the switch 486. For example, if switch 452 is closed, then the output of the amplifier 448 may provide feedback to the inverting input of the amplifier 448. As a result, VREF_BGR may be provided as VREF. However, when switch 452 is open, then the voltages on capacitors CIN 484 and CFB 450 may determine the voltage level of VREF.

The illustrated embodiment of the auto-zero offset voltage generator 482 includes a PMOS transistor 442, an NMOS transistor 444, an NMOS transistor 446, and a switch 486. To account for process variation, the transistors 442-446 may be similar to analogous transistors of the comparator 212, but scaled to reduce their respective variation and random noise. The transistor 444 is further scaled to reduce its overdrive voltage. For example, PMOS transistor 442 may be have a larger "m," which may equal aN times the PMOS transistors of the comparator 212. The NMOS transistor 444 may be sized larger as well, and may have an m=16 aN to reduce its overdrive voltage, and the NMOS transistor 446 may have an M of aN/2. The NMOS transistor 444 may be associated with the NMOS input transistors and NMOS transistor 446 may be associated with the NMOS tail transistor, both of comparator 212.

The three transistors 442-446 may be coupled in series between VDD and ground, and, for example, may emulate a reference voltage side of the comparator 212. The PMOS transistor 442 may be coupled to diode-coupled with a source coupled to VDD and a drain coupled to a drain of the NMOS transistor 444. The NMOS transistor may also be diode-coupled with a source coupled to a drain of the NMOS transistor 446, which may be coupled to ground at a source. A gate of the NMOS transistor 446 may be coupled to receive a TAIL BIAS signal, which may enable the auto-zero offset voltage generator 482. The TAIL BIAS signal may be the same or similar to the TAIL BIAS signal received by the comparator 212.

The switch 486 may be a three-terminal switch and may have one terminal coupled to a node Voff_H and a second terminal coupled to a node Voff_L. A third terminal of the switch 486 may be coupled to a first side of the capacitor CIN 484. The node Voff_H may be the node where the PMOS transistor 442 is coupled to the NMOS transistor 444, whereas the node Voff_L may be the node where the NMOS transistor 444 is coupled to the NMOS transistor 446. In general, the transistors 442-446 may operate as a voltage divider with a voltage difference between voltages at node Voff_H and Voff_L being almost proportional to Vth of the NMOS input transistors of the comparator 212.

The voltage at node D, when switch 452 is in an open position, may be equal to the voltage of VREF_BGR.

Figure 4B:
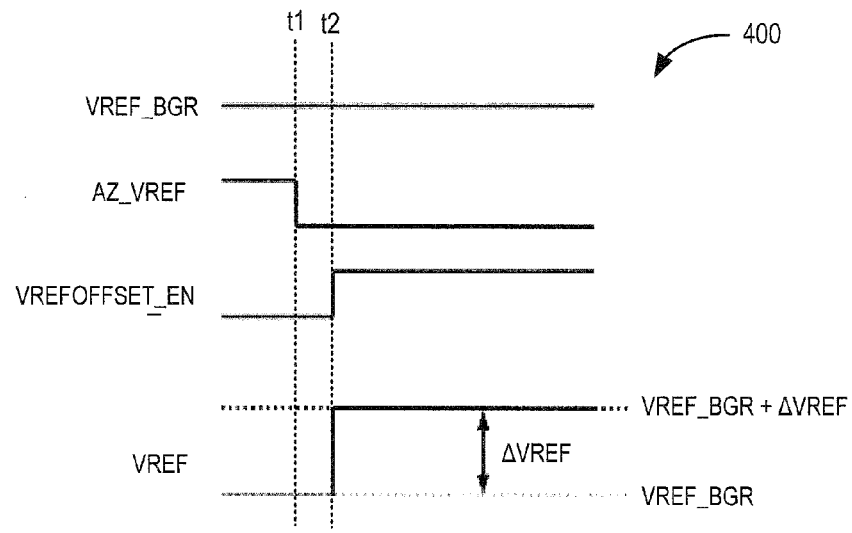
FIG. 4B is an example timing diagram according to an embodiment of the present disclosure.

FIG. 4B is an example timing diagram 400 according to an embodiment of the present disclosure. The timing diagram will be used to illustrate an example operation of the reference voltage generator 414.

Prior to time t1, VREF_BGR may be provided to the non-inverting input of the amplifier 448, and control signal AZ_VREF may be at a high level, which may result in the switch 452 being closed. As such, the output of the amplifier 448 may be coupled to the inverting input of the amplifier 448. Accordingly, VREF may be at VREF_BGR. However, at time t1, AZ_REF may transition low, which may cause switch 452 to open. Opening switch 452 may cause the output of the amplifier 448 to be capacitively coupled to the negative input through CFB 450.

Prior to time t2, VREFOFFSET_EN may be low, which may cause the voltage on node Voff_H to be coupled to CIN 484. However, at time t2, VREFOFFSET_EN may transition high, which may cause the switch 486 to couple the voltage on node Voff_L to the capacitor CIN 484. As a result, the voltage ΔVREF may be added to VREF_BGR. ΔVREF may be proportional to (Voff_H−Voff_L)*CIN/CFB, which may be proportional to Vth of the NMOS transistors of the comparator 212.

Figure 4C:
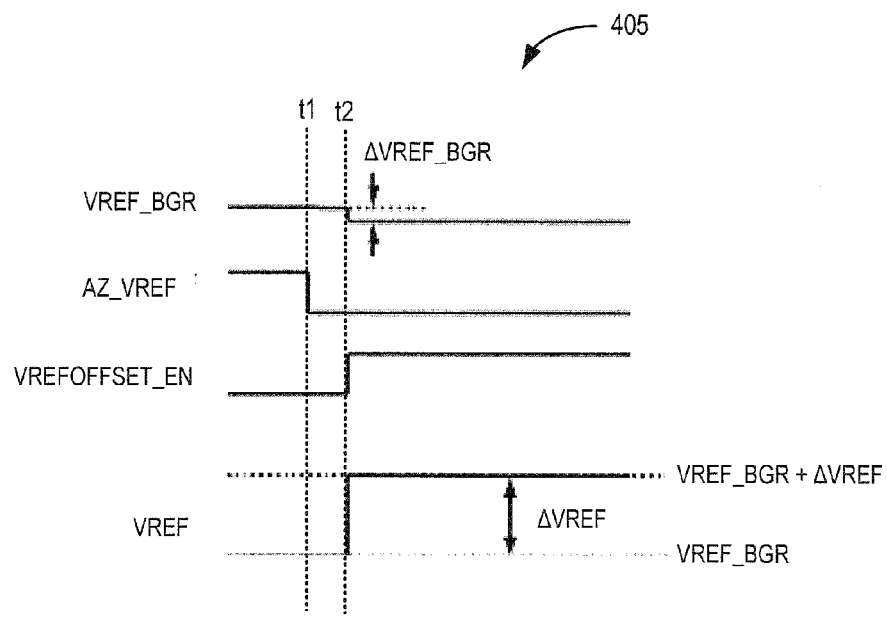
FIG. 4C is an example timing diagram according to an embodiment of the present disclosure.

FIG. 4C is an example timing diagram 405 according to an embodiment of the present disclosure. The timing diagram 405 will be used to illustrate an example operation of the reference voltage generator 414. The timing diagram 405 may be similar to the timing diagram 400 except that a decrease in the voltage level of VREF_BGR may occur at time t2. At time t2, the voltage divider 440 may receive a signal SEL_VREF, which may change the settings of the voltage divider 440. As a result, VREF_BGR may be reduced by an amount ΔVREF_BGR. ΔVREF_BGR may be an amount to ensure a voltage margin with respect to Vth of the NMOS input transistors of the comparator 212 is obtained. For example, ΔVREF_BGR may be around 100 mV.

Figure 5:
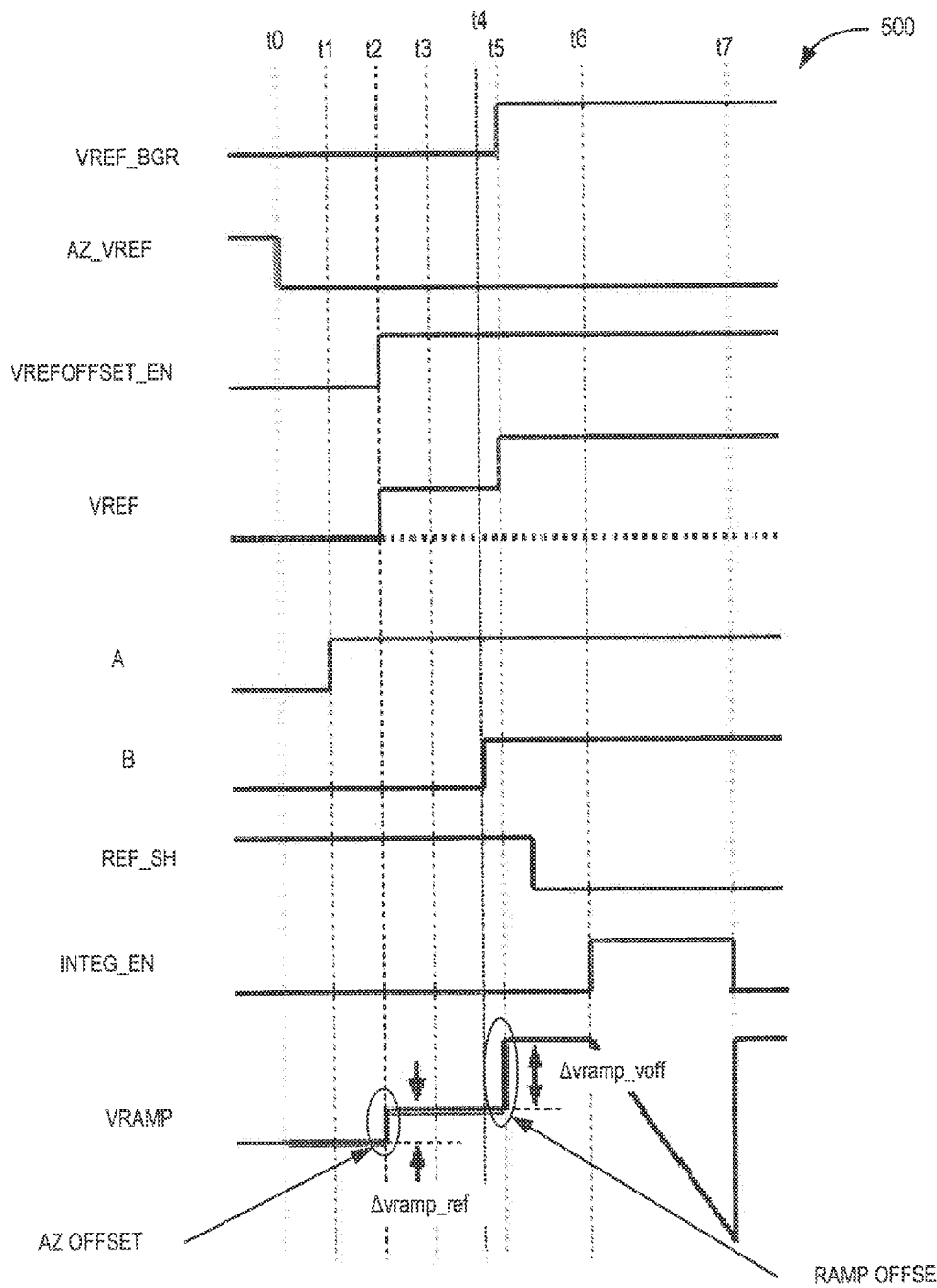
FIG. 5 is an example timing diagram according to an embodiment of the present disclosure.

FIG. 5 is an example timing diagram 500 according to an embodiment of the present disclosure. The timing diagram 500 will be discussed with reference to the ramp generator 310, the reference voltage generator 414, and the comparator 212. The timing diagram 500 may be similar to the diagram 300 except the sample and hold operation of VREF occurs after Ramp Offset is applied, e.g., added to VREF, instead of before.

At time t0, control signal AZ_REF transitions low, which may cause the switch 452 to open. Opening the switch 452 may make the node D floating but coupled with VREF via the feedback capacitance CFB 450.

At time t1, control signal A may transition high, which may disable auto-zero switch AZQ1 of the comparator 212. Disabling AZQ1 may decoupled the gate of the ramp reference side NMOS transistor.

At time t2, control signal VREFOFFSET_EN may transition high, which results in switch 486 of the auto-zero offset generator 482 coupling node Voff_L to the capacitor CIN 484, which prior to time t2 was coupled to node Voff_H. As shown in FIG. 4B, for example, moving switch 486 from Voff_H to Voff_L may cause ΔVREF to be added to VREF_BGR, where ΔVREF is proportional to (Voff_H−Voff_L)*CIN/CFB. In FIG. 5, ΔVREF is referred to as ΔVramp_ref. As a result, VREF is increased by ΔVREF.

At time t4, control signal B transitions high, which decouples auto-zero switch AZQ2. As a result, bitline input NMOS transistor of the comparator 212 is ready to receive image charge. It should be noted that switch 360 of VSH circuit 318 is in the closed position so that VREF continues to be provided to VSH circuit 318 by reference voltage generator 414.

At time t5, control signal SEL_VREF is changed and VREF_BGR is increased by the voltage proportional Ramp Offset. Because the switch 360 is closed prior to time t5, Ramp Offset is added to VREF, which in turn is added to VRAMP.

At time t6, control signal REF_SH transitions low, which opens switch 360 of the VSH circuit 318. Prior to time t6, VSH circuit 318 was being provided VREF from reference voltage generator 314, which includes the AZ Offset voltage increase. Switch 360 may be opened to isolate noise generated in the reference voltage generator 314 from the integrator 322. Additionally, after switch 360 is opened, the VSH circuit 318 may continue to hold VREF (including AZ Offset and Ramp Offset) to the integrator 322.

At time t7, control signal INTEG_EN transitions high, which results in integrator 322 integrating the current from current source 320 with VREF. The integration may result in the linear decrease of VRAMP during the integration time, which may end at time t8 when INTEG_EN transitions low. After time t8, VRAMP will increase back to VREF due to VREF being held by the VSH circuit 318. Additional integrations may subsequently occur.

Figure 6A:
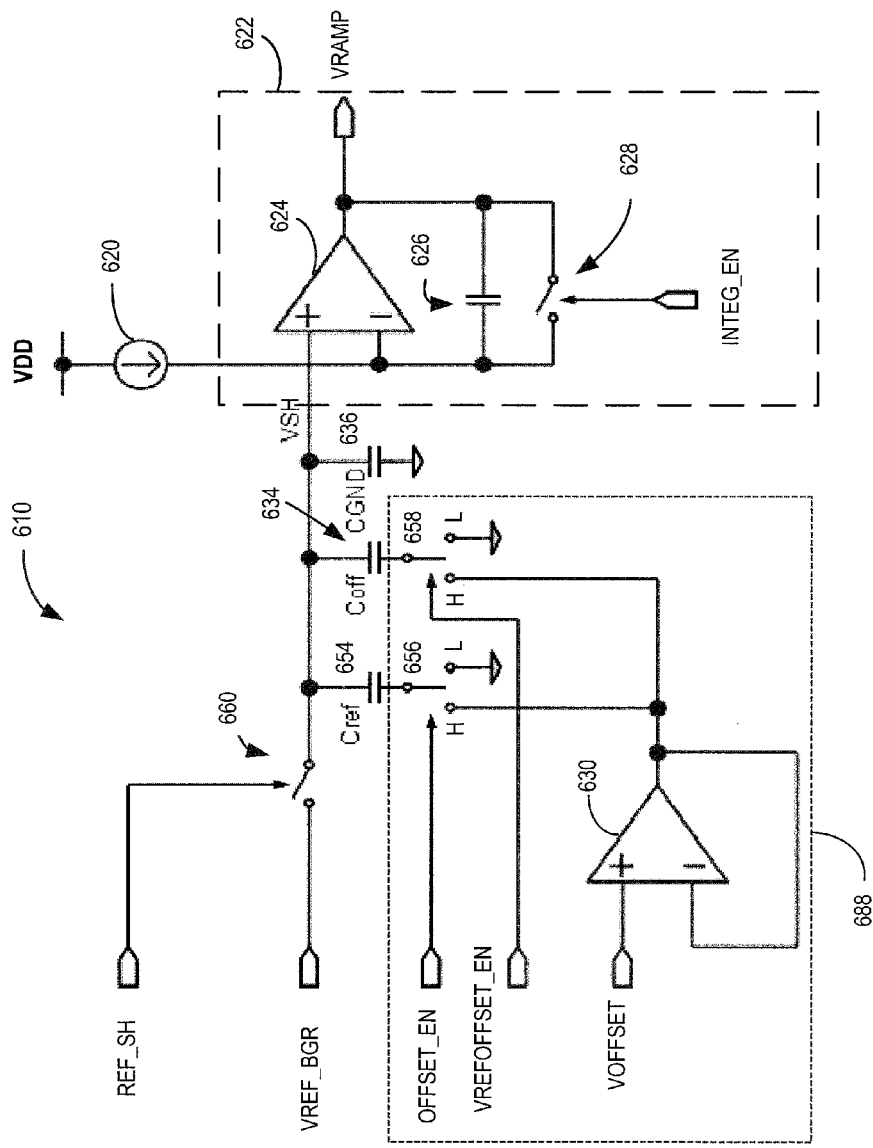
FIG. 6A is a schematic of a ramp generator in accordance with an embodiment of the present disclosure.

FIG. 6A is a schematic of a ramp generator 610 in accordance with an embodiment of the present disclosure. The ramp generator 610 may be an example of the ramp generator 110. The ramp generator 610 may provide a voltage signal VRAMP to a reference voltage input of a comparator, such as the comparator 212. The ramp generator 610 may add various offset voltages to VRAMP to increase the voltage range available for the comparator 212, for example. In some embodiments, the ramp generator 610 may be a combination of the reference voltage generator 314 and the ramp offset generator 316.

The illustrated embodiment of the ramp generator 610 includes a voltage generator 688, an integrator 622, capacitor Cref 654, capacitor Coff 634, and capacitor CGND 636. The capacitors 654, 634, and 636 may be coupled between the voltage generator 688 and the integrator 622. The integrator 622 may be similar to the integrator 322, and as such may not be discussed in detail with regards to FIG. 6A. Additionally, the capacitors 634 and 636 may be similar to the capacitors of Voffcap 334 and SHcap 336 of the VSH circuit 318, and may not be discussed in detail with regards to FIG. 6A.

The voltage generator 688 may generate ΔVRAMP_REF, e.g., AZ Offset, and ΔVRAMP_VOFF, e.g., Ramp Offset. AZ Offset and Ramp Offset may both may be added to VREG_BGR, which may be due to the state of the switches 656 and 658, respectively. AZ Offset and Ramp Offset may be determined by the voltage VOFFSET and the parallel combination of the capacitors Cref 654, Coff 634, and CGND 636, which may be sized to provide the desired voltages AZ Offset and Ramp Offset. In some embodiments, VREF_BGR may be provided by a combination of the amplifier 438 and the voltage divider 440 of the reference voltage generator 414.

Figure 6B:
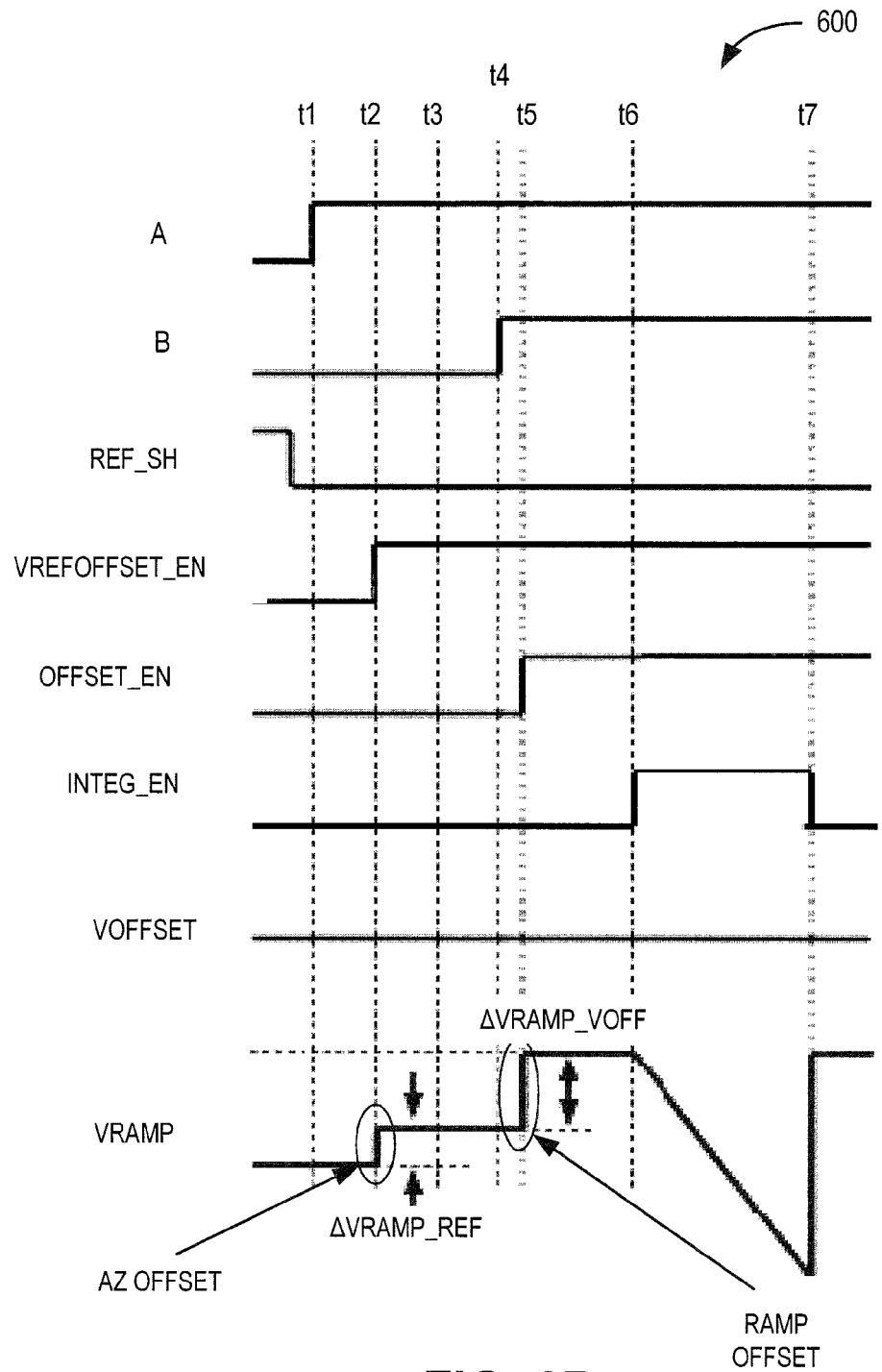
FIG. 6B is an illustrative timing diagram in accordance with an embodiment of the present disclosure.

FIG. 6B is an illustrative timing diagram 600 in accordance with an embodiment of the present disclosure. The timing diagram 600 will be used to illustrate the operation of the ramp generator 610 in relation to providing VRAMP to the comparator 212, for example. The voltage reference signal VRAMP may be used by the comparator 212 for ADC operations, for example.

Prior to time t1, control signal REF_SH may transition low, which may cause switch 660 to open. As a result, VREF_BGR may be disconnected from the input of the integrator 322, but VREF_BGR may be held on capacitor CGND 636, Coff 634 and Cref 654. At time t1, control signal A may transition high, which may disable auto-zero switch AZQ1. As a result, the VRAMP input of the comparator 212 may be ready to receive the reference signal VRAMP.

Prior to time t2, switch 658 may be coupled to ground and the capacitance Coff 634 may be discharged. At time t2, however, control signal VREFOFFSET_EN may transition high, which may cause the switch 658 to couple to the amplifier 630, which may provide the voltage VOFFSET to one side of the capacitor Coff 634 instead of ground. Coupling the switch 658 to the amplifier 630 may charge the one side of Coff 634 to VOFFSET, which may result in voltage ΔVRAMP_REF to be added to VREF_BGR, which is present on the capacitor CGND 636. ΔVRAMP_REF, which may also be referred to as AZ Offset, may be proportional to VOFFSET*(Coff/(Creff+Coff+CGND)). Additionally, ΔVRAMP_REF may also be proportional to Vth of the NMOS input transistors of the comparator 212.

At time t4, control signal B may transition high, which may disable auto-zero switch AZQ2. As a result, the bitline input of the comparator 212 may be ready to receive an image charge signal.

Prior to time t5, switch 654 may be coupled to ground, which may discharge the capacitor Cref 654. At time t5, however, control signal OFFSET_EN may transition high, which may cause switch 656 to be coupled to the amplifier 630, which may provide the voltage VOFFSET to the capacitor Cref 654 instead of ground. Coupling the switch 656 to the amplifier 630 may charge one side of Cref 654, which may result in voltage ΔVRAMP_VOFF to be added to VREF_BGR, which is present on the capacitor CGND 636. ΔVRAMP_VOFF, which may also be referred to as Ramp Offset, may be proportional to VOFFSET*(Cref/(Cref+Coff+CGND)).

At time t6, control signal INTEG_EN transitions high, which results in integrator 622 integrating the current from current source 620 with VRAMP (including AZ Offset and Ramp Offset). The integration may result in the linear decrease of VRAMP during the integration time, which may end at time t7 when INTEG_EN transitions low. After time t7, VRAMP may increase back to VREF_BGR (including AZ Offset and Ramp Offset) due to VREF_BGR (including AZ Offset and Ramp Offset) being held by the capacitor CGND 636. Additional integrations may subsequently occur.

Figure 7A:
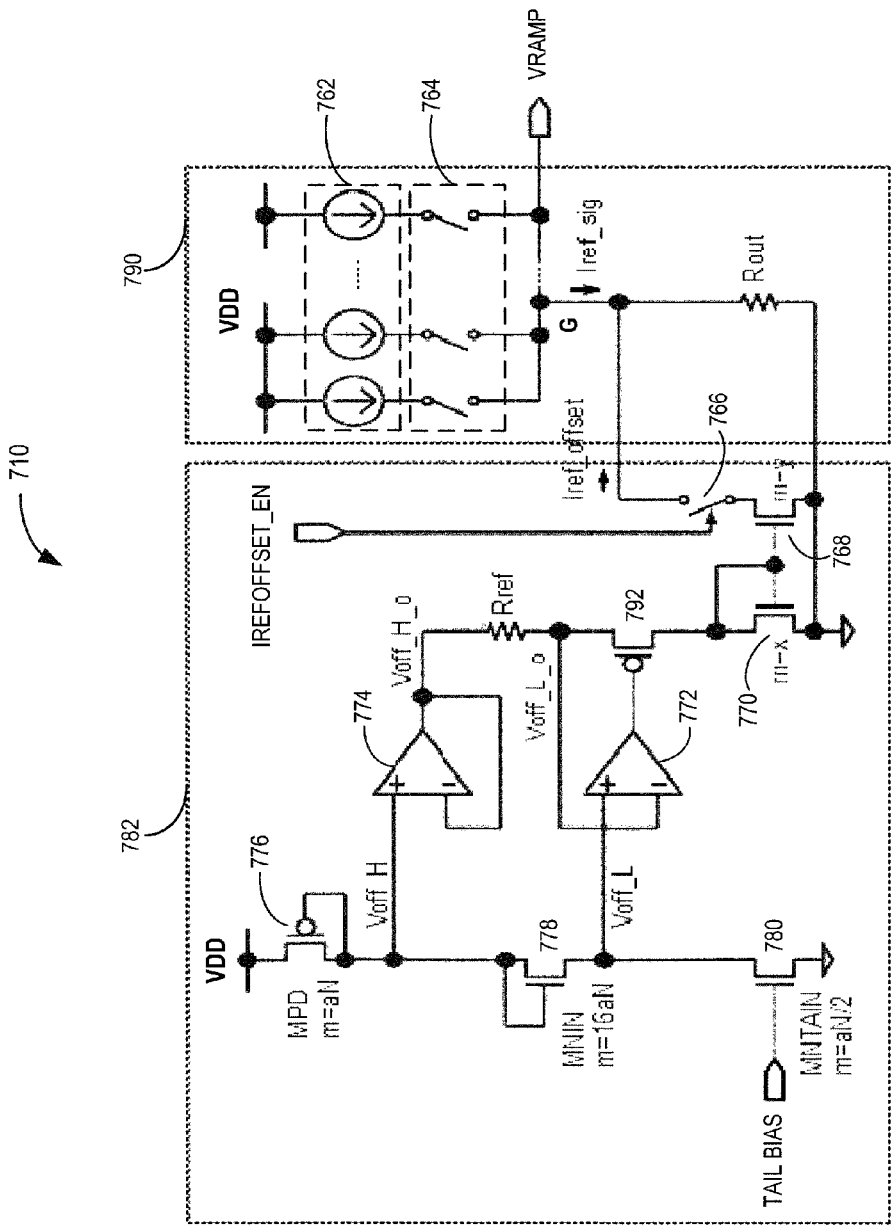
FIG. 7A is an example schematic of a ramp generator in accordance with an embodiment of the present disclosure.

FIG. 7A is an example schematic of a ramp generator 710 in accordance with an embodiment of the present disclosure. The ramp generator 710 may be an example of the ramp generator 110. The ramp generator 710 may provide a reference voltage signal VRAMP to the comparator 212 for ADC operations, for example.

The illustrated embodiment of the ramp generator 710 includes a reference current generator 782 and a current steering digital-to-analog converter (DAC) 790. The current steering DAC 790 may generate a current Iref_sig, which may be provided to the resistor Rout to generate the voltage signal VRAMP. The reference current generator 782 may generate a current Iref_offset, which may be provided to Rout based on the state of the switch 766. The subtraction of Iref_offset from Iref_sig may add the AZ Offset voltage to VRAMP, for example.

The illustrated embodiment of the current steering DAC 790 may include a plurality of current sources 762 coupled in parallel between a reference voltage VDD and a respective switch of a plurality of switches 764. The plurality of switches 764 may be coupled in parallel between their respective current source and a common node G. A combination of current sources of the plurality of current sources 762, based on their respective switches being in a closed state, may generate the current Iref_sig. Iref_sig may be provided to node G, and may flow through resistor Rout. The voltage drop across Rout may generate the voltage signal VRAMP on an output of the ramp generator 710.

The illustrated embodiment of the reference current generator 782 may include a PMOS transistor 776, an NMOS transistor 778, an NMOS transistor 780, an amplifier 774, an amplifier 772, a transistor 770, a transistor 768, and a switch 766. To account for process variation, transistors 776-780 may be similar to analogous transistors of the comparator 212, but scaled to reduce their respective overdrive voltages, which may account for process variations. For example, PMOS transistor 776 may be have a larger "m," which may equal aN times the area of the PMOS transistors of the comparator 212. The NMOS transistor 778 may be sized larger as well, and may have an m=16 aN, and the NMOS transistor 780 may have an m of aN/2. The NMOS transistor 778 may correspond to the NMOS input transistors of the comparator 212, and the NMOS transistor 780 may correspond to the NMOS tail transistor, both of comparator 212.

The three transistors 776-780 may be coupled in series between VDD and ground, for example. The PMOS transistor 776 may be diode-coupled with a source coupled to VDD and a drain coupled to a drain of the NMOS transistor 778. The NMOS transistor 778 may also be diode-coupled with a source coupled to a drain of the NMOS transistor 780, which may be coupled to ground at a source. A gate of the NMOS transistor 780 may be coupled to receive a TAIL BIAS signal, which may enable the reference current generator 782.

The amplifier 774 may have a non-inverting input coupled to node Voff_H, and an inverting input coupled to receive feedback from an output of the amplifier 774. The amplifier 772 may have a non-inverting input coupled to node Voff_L, and an inverting input coupled to receive the output of the amplifier 774 via a resistor Rref. An output of the amplifier 772 may be coupled to a gate of a transistor 792. The transistor 792 may have a source coupled to the resistor Rref, and a drain coupled to a drain of transistor 770. Transistor 770 may be diode coupled with its gate also coupled to a gate of the transistor 768. Source of transistors 770 and 768 may be coupled together and to ground. Additionally, one side of the resister Rout of the current steering DAC 790 may also be coupled to the sources of transistors 770 and 760, and to ground. A drain of the transistor 768 may be coupled to one side of switch 766, which may be coupled to node G on the other side. Switch 766 may receive control signal IREFOFFSET_EN.

The reference current generator 782 may generate Iref_offset so that a voltage drop across Rout due to Iref_offset generates ΔVRAMP_REF, e.g., AZ Offset. Iref_Offset may be generated based on the difference in voltages provided by amplifiers 774 and 772, such as Voff_H_o and Voff_L_o. Voff_H_o and Voff_L_o may be almost same as Voff_H and Voff_L, respectively. Further, the difference between Voff_H_o and Voff_L_o may be proportional to Vth of the NMOS transistors of the comparator 212 plus a quarter of their overvoltage, e.g., (Vth+Vov/4). A ratio of the m factors of transistors 768 and 770, and Rref may also determine Iref_offset. Iref_offset may be converted to voltage by Rout to generate ΔVRAMP_REF. Accordingly, ΔVRAMP_REF may be proportional to (Vth+Vov/4)*(y/x)*(Rout/Rref). As such, when switch 766 is closed, Iref_offset may be subtracted from Iref_sig, which may decrease the amount of current flowing through Rout by Iref_offset causing ΔVRAMP_REF, e.g., AZ Offset, to be subtracted from VRAMP. However, opening switch 766 may increase Iref_sig by an amount proportional to Iref_offset, which may cause VRAMP to increase by an amount proportional to ΔVRAMP_REF, e.g., AZ Offset.

Figure 7B:
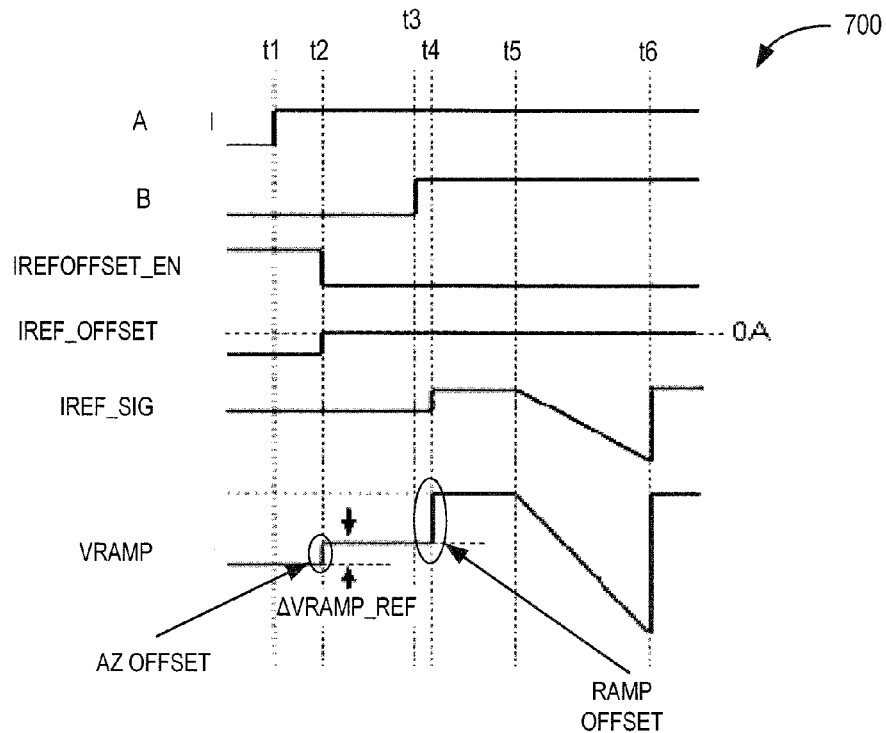
FIG. 7B is an example timing diagram in accordance with an embodiment of the present disclosure.

FIG. 7B is an example timing diagram 700 in accordance with an embodiment of the present disclosure. The timing diagram 700 will be used to illustrate one example operation of the ramp generator 710.

At time t1, control signal A transitions high, which results in auto-zero switch AZQ1 being disabled, and in turn results in the gate of the VRAMP input NMOS transistor of the comparator 212 being decoupled from its drain.

Prior to time t2, switch 766 is in a closed state so that Iref_offset is being provided to ΔVRAMP_REF. Specifically, reference current generator 782 may be generating the current Iref_offset through Rref that is proportional to a current that may produce ΔVRAMP_REF across Rout.

Because Iref_offset is flowing through transistors 792 and 770, the same or proportional current may be flowing through transistor 768 due to current mirroring. Further, because switch 766 is closed, Iref_offset is being subtracted from Iref_sig, such that Iref_sig−Iref_offset is flowing through Rout. As a result, VRAMP is at a voltage that does not include ΔVRAMP_REF, e.g., AZ Offset.

At time t2, however, control signal IREFOFFSET_EN transitions low, which causes switch 766 to open. As a result, Iref_offset may no longer be subtracted from Iref_sig, which may result in the additional current flowing through Rout, and thus VRAMP may increase by Iref_offset*Rout, which may be proportional to ΔVRAMP_REF, e.g., AZ Offset. In general, opening switch 766 may add Iref_offset back to the current flowing through Rout so that VRAMP increases by ΔVRAMP_REF.

After time t2, the timing diagram 700 may be similar to timing diagram 300, for example, and will not be fully discussed. However, during the ADC between times t5 and t6, the current steering DAC 790 may linearly decrease Iref_sig to provide the shape of VRAMP as shown in the timing diagram 700.

Figure 7C:
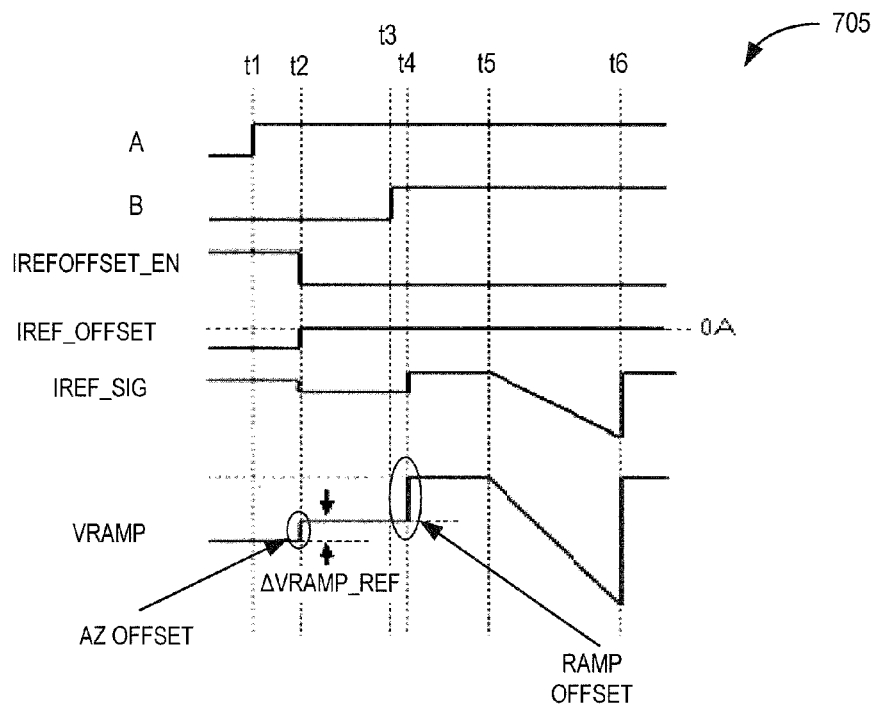
FIG. 7C is an example timing diagram in accordance with an embodiment of the present disclosure.

FIG. 7C is an example timing diagram 705 in accordance with an embodiment of the present disclosure. The timing diagram 705 will be used to illustrate an example operation of the ramp generator 710. The timing diagram 705 is different than the timing diagram 700 due to a decrease in Iref_sig at times t2, which may result in a slight decrease in VRAMP during the same time. The decrease in Iref_sig may provide some margin when comparing ΔVRAMP_REF, e.g., AZ Offset, to Vth of the NMOS transistors of the comparator 212. An example amount of margin may be around 100 mV. The decrease in Iref_sig may be provided by changes in the plurality of switches 764 of the current steering DAC 790, for example.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method, comprising:
   disabling a first auto-zero switch of a comparator, the first auto-zero switch coupled to a ramp voltage input of the comparator;
   increasing, by a ramp generator, an auto-zero voltage level of a ramp voltage provided to the ramp voltage input of the comparator;
   disabling a second auto-zero switch of the comparator, the second auto-zero switch coupled to a bitline input of the comparator;
   increasing a ramp offset voltage level of the reference voltage provided to the reference voltage input of the comparator by the ramp generator; and
   comparing a voltage on the bitline input to the reference voltage on the reference voltage input.

2. The method of claim 1, wherein increasing the auto-zero voltage level of the ramp voltage provided to the ramp voltage input of the comparator by the ramp generator comprises:
   increasing a voltage level of a reference voltage generated by a reference voltage generator of the ramp generator after disabling of the first auto-zero switch of the comparator;
   generating the ramp voltage at least in response to the reference voltage generated by the reference generator; and
   providing the ramp voltage to the ramp voltage input of the comparator.

3. The method of claim 1, wherein increasing the auto-zero voltage level of the ramp voltage provided to the ramp voltage input of the comparator by the ramp generator comprises:
   increasing the auto-zero voltage level of the ramp voltage by an amount proportional to a threshold voltage of NMOS transistors forming the ramp voltage input and the bitline input of the comparator.

4. The method of claim 1, wherein increasing the auto-zero voltage level of the reference voltage provided to the reference voltage input of the comparator by the ramp generator comprises:
   providing a first reference voltage to a first capacitor, the first capacitor coupled between ground an input of an integrator;
   providing an offset voltage level to a second capacitor coupled between the input of the integrator on a first side and an output of a comparator on a second side; and
   coupling the second side of the second capacitor to ground to discharge the auto-zero voltage level onto the first capacitor, wherein the first reference voltage provided to the first capacitor increases the auto-zero voltage level by an amount proportional to a threshold voltage of NMOS transistors forming the ramp voltage input and the bitline input of the comparator.

5. The method of claim 1, wherein increasing the auto-zero voltage level of the reference voltage provided to the reference voltage input of the comparator by the ramp generator comprises:
   generating a reference current by a current reference generator of the ramp generator, wherein the reference current generates the reference voltage as a drop across a resistor;
   generating an offset current by a current offset generator coupled to the current reference generator; and
   adding the offset current to the reference current to increase the auto-zero voltage level by an amount proportional to a threshold voltage of NMOS input transistors of the comparator.

6. The method of claim 1, further comprising:
   receiving an image charge signal on the bitline input of the comparator; and
   comparing the image charge signal to the ramp voltage during a signal integration.

7. A method, comprising:
   providing, by a ramp generator, a base reference voltage to a reference voltage input of a comparator, the reference voltage input including an NMOS transistor having a gate, wherein the base reference is coupled to the gate of the NMOS transistor;
   disabling a first auto-zero switch coupled to the reference voltage input of the comparator;

adding, by the ramp generator, an auto-zero offset voltage to the base reference voltage; and disabling a second auto-zero switch coupled to a bitline input of the comparator.

8. The method of claim 7, wherein the auto-zero offset voltage is proportional to a threshold voltage of the NMOS transistor.

9. The method of claim 7, further comprising:

adding, by the ramp generator, a ramp offset voltage to a combination of the base reference voltage and the auto-zero offset voltage, wherein the ramp generator discharges a capacitor to add the ramp offset voltage.

10. The method of claim 7, wherein the ramp generator generates the base reference voltage by providing a base reference current to an output resistor, and wherein a voltage drop across the output resistor due to the base reference current is the base reference voltage, and wherein adding, by the ramp generator, an auto-zero offset voltage to the base reference voltage comprises:

adding an offset reference current to the base reference current to increase a voltage drop across the output resistor, wherein the voltage drop across the output resistor due to adding the offset reference current to the base reference current is the base reference voltage plus the auto-zero offset voltage.

11. The method of claim 7, wherein adding, by the ramp generator, the auto-zero offset voltage to the base reference voltage comprises:

providing the base reference voltage to an integrator at a first time;

providing the auto-zero offset voltage to the integrator at a second time, the integrator adding the auto-zero offset voltage to the base reference voltage based on a combination of a feedback voltage and a voltage difference proportional to a threshold voltage of the NMOS transistor of the comparator being capacitively coupled to an input of the comparator.

12. The method of claim 7, wherein the base reference voltage is provided to a sample and hold circuit, and is held by a first capacitor, and wherein the sample and hold circuit includes a second capacitor coupled to charge to a voltage proportional to the auto-zero offset voltage, and wherein adding, by the ramp generator, an auto-zero offset voltage to the base reference voltage comprises discharging the voltage proportional to the auto-zero offset voltage held on the second capacitor to add to the base reference voltage held on the first capacitor.

13. The method of claim 7, further comprising:

adding, by the ramp generator, a ramp offset voltage to a combination of the base reference voltage and the auto-zero offset voltage before disabling the second auto-zero switch.

14. The method of claim 7, further comprising:

receiving, by the comparator, an image charge signal on the bitline input;

integrating, by the ramp generator, a combination of the base reference voltage, the auto-zero offset voltage, and a ramp offset voltage to provide a negative ramp voltage to the reference voltage input of the comparator; and comparing the image charge signal to the negative ramp voltage to provide a digital representation of the image charge signal.

15. An image system, comprising:

a pixel array to capture image light and generate image charge;

readout circuitry coupled to readout the image charge and convert the image charge to one or more digital signals corresponding to the image charge in response to a comparison of the image charge to a ramp voltage, the readout circuitry including:

a comparator coupled to receive the ramp voltage at a reference signal input and the image charge at a bitline input, wherein the reference signal input and the bitline input are auto-zeroed before the comparison of the image charge to the ramp voltage by enabling respective reference input and bitline input auto-zero switches; and a ramp generator coupled to provide the ramp voltage to the readout circuitry, wherein the ramp voltage is increased by an auto-zero offset voltage after the reference input auto-zero switch is disabled but before the bitline input auto-zero switch is disabled.

16. The imaging system of claim 15, wherein the auto-zero offset voltage is proportional to a threshold voltage of NMOS input transistors of the comparator, the NMOS input transistors forming the reference signal and bitline inputs of the comparator.

17. The imaging system of claim 15, wherein the ramp generator includes a voltage sample and hold circuit having at least first, second, and third capacitors, with the first capacitor coupled to receive an offset voltage, wherein the first capacitor is discharged to add the auto-zero offset voltage to a reference voltage stored on the third capacitor, and wherein the auto-zero offset voltage is provided responsive to the offset voltage and a combination of the first, second, and third capacitors.

18. The imaging system of claim 15, wherein the ramp generator comprises:

a steering digital-to-analog converter (DAC) coupled to generate a reference current, and provide the reference current to an output resistor to generate the ramp voltage; and an offset reference current generator coupled to provide an offset reference current to the steering DAC, wherein the addition of the offset reference current to the reference current increases the ramp voltage by the auto-zero offset voltage.

19. The imaging system of claim 15, wherein the ramp generator comprises:

an auto-zero offset voltage generator coupled to an integrator through an input capacitor, wherein the integrator adds the auto-zero offset voltage to a reference voltage to provide the ramp voltage, and wherein the auto-zero offset voltage is generated responsive to a combination of a feedback voltage coupled to an input of the integrator through a feedback capacitor and a voltage difference proportional to a threshold voltage of the NMOS transistor of the comparator coupled to the input of the integrator through the input capacitor.

20. The imaging system of claim 15, wherein the ramp generator comprises:

a voltage sample and hold circuit coupled to receive a reference voltage from a reference voltage generator, the voltage sample and hold circuit including first and second capacitors, wherein the first capacitor is coupled to hold the reference voltage, and the second capacitor is coupled to provide a ramp offset voltage amount increase to the reference voltage; and an integrator coupled to the voltage sample and hold circuit, the integrator coupled to integrate a combination of the reference voltage, the auto-zero offset voltage, and the ramp offset voltage to provide a negative ramp voltage to the comparator.

21. The imaging system of claim 20, wherein the ramp generator comprises:

a ramp offset voltage generator capacitively coupled to provide the ramp offset voltage to the voltage sample and hold circuit.

\* \* \* \* \*